United States Patent
Roy et al.

(10) Patent No.: US 12,107,128 B2
(45) Date of Patent: Oct. 1, 2024

(54) METHOD OF PRODUCING A SEMICONDUCTOR DEVICE HAVING A FERROELECTRIC GATE STACK

(71) Applicant: Infineon Technologies AG, Neubiberg (DE)

(72) Inventors: Saurabh Roy, Villach (AT); Thomas Aichinger, Faak am See (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/461,042

(22) Filed: Sep. 5, 2023

(65) Prior Publication Data
US 2023/0411460 A1 Dec. 21, 2023

Related U.S. Application Data

(62) Division of application No. 17/387,504, filed on Jul. 28, 2021, now Pat. No. 11,791,383.

(51) Int. Cl.
*H01L 29/66* (2006.01)
*H01L 29/16* (2006.01)
(Continued)

(52) U.S. Cl.
CPC ........ *H01L 29/1608* (2013.01); *H01L 29/516* (2013.01); *H01L 29/66053* (2013.01); *H01L 29/78391* (2014.09)

(58) Field of Classification Search
CPC ............... H01L 29/1608; H01L 29/516; H01L 29/66053; H01L 29/78391
(Continued)

(56) References Cited

U.S. PATENT DOCUMENTS 6,335,550 B1 1/2002 Miyoshi et al.
6,887,799 B1 * 5/2005 Li ..................... H01L 21/28185
257/E21.208
(Continued)

FOREIGN PATENT DOCUMENTS

CN 206003774 U 3/2017
DE 102009038710 A1 4/2011

OTHER PUBLICATIONS

Hoffmann, Michael, et al., "Ferroelectric phase transitions in nanoscale HfO2 films enable giant pyroelectric energy conversion and highly efficient supercapacitors", Nano Energy, ISSN: 2211-2855, vol. 18, Nov. 2015, 154-164.
(Continued)

*Primary Examiner* — Sheikh Maruf
(74) *Attorney, Agent, or Firm* — Murphy, Bilak & Homiller, PLLC

(57) ABSTRACT

A method of producing a semiconductor device includes forming a plurality of transistor cells in a SiC substrate and electrically connected in parallel to form a transistor having a specified operating temperature range. Forming each transistor cell includes forming a gate structure having a gate electrode, and a gate dielectric stack separating the gate electrode from the SiC substrate and including a ferroelectric insulator. The method further includes doping the ferroelectric insulator with a doping material such that the Curie temperature of the ferroelectric insulator is in a range above the specified operating temperature range of the transistor.

20 Claims, 8 Drawing Sheets

(51) Int. Cl.
*H01L 29/51* (2006.01)
*H01L 29/78* (2006.01)

(58) Field of Classification Search
USPC ........................................................ 257/295
See application file for complete search history.

(56) References Cited

U.S. PATENT DOCUMENTS

| | | | |
|---|---|---|---|
| 8,809,971 | B2 | 8/2014 | Schulze et al. |
| 9,871,136 | B2 | 1/2018 | Chen et al. |
| 9,978,868 | B2 | 5/2018 | Lai et al. |
| 2003/0235064 | A1 | 12/2003 | Batra et al. |
| 2004/0051126 | A1 | 3/2004 | Cuchiaro et al. |
| 2005/0035401 | A1 | 2/2005 | Yamaguchi et al. |
| 2005/0282329 | A1* | 12/2005 | Li ................ H01L 21/823857 |
| | | | 257/E21.639 |
| 2006/0073653 | A1 | 4/2006 | Jang et al. |
| 2006/0146102 | A1 | 7/2006 | Kim et al. |
| 2007/0075351 | A1* | 4/2007 | Schulz ................ H01L 27/1211 |
| | | | 257/E21.639 |
| 2007/0111448 | A1 | 5/2007 | Li et al. |
| 2008/0105978 | A1 | 5/2008 | Schmitt et al. |
| 2008/0116523 | A1* | 5/2008 | Li ........................ H01L 29/517 |
| | | | 257/E21.639 |
| 2008/0251816 | A1 | 10/2008 | Tanaka et al. |
| 2010/0044853 | A1 | 2/2010 | Dekker et al. |
| 2010/0129968 | A1* | 5/2010 | Li .................... H01L 29/66795 |
| | | | 438/587 |
| 2010/0237432 | A1 | 9/2010 | Takeoka et al. |
| 2010/0285662 | A1 | 11/2010 | Kim et al. |
| 2010/0308400 | A1 | 12/2010 | Darwish et al. |
| 2011/0049593 | A1 | 3/2011 | Schulze et al. |
| 2011/0170330 | A1 | 7/2011 | Oezyilmaz et al. |
| 2011/0241123 | A1* | 10/2011 | Li ................... H01L 21/823437 |
| | | | 257/E27.06 |
| 2012/0248522 | A1 | 10/2012 | Goyal et al. |
| 2012/0292677 | A1 | 11/2012 | Dubourdieu et al. |
| 2013/0037823 | A1 | 2/2013 | Kanemura et al. |
| 2013/0099253 | A1 | 4/2013 | Ohtsuka et al. |
| 2013/0248950 | A1 | 9/2013 | Kang et al. |
| 2014/0117464 | A1 | 5/2014 | Chang et al. |
| 2015/0364566 | A1 | 12/2015 | Liu et al. |
| 2015/0380511 | A1 | 12/2015 | Irsigler et al. |
| 2017/0141235 | A1* | 5/2017 | Lai ...................... H01L 29/6684 |
| 2017/0358684 | A1 | 12/2017 | Chen et al. |
| 2018/0083141 | A1* | 3/2018 | Chen .................... H01L 29/517 |
| 2018/0182860 | A1* | 6/2018 | Lee ................ H01L 21/823842 |
| 2018/0240804 | A1 | 8/2018 | Yoo |
| 2019/0067488 | A1* | 2/2019 | Tsai ................... H01L 29/66545 |
| 2019/0148510 | A1* | 5/2019 | Chien ............... H01L 29/66795 |
| | | | 257/192 |
| 2019/0207009 | A1* | 7/2019 | Yamaguchi ......... H01L 29/6684 |
| 2020/0098926 | A1 | 3/2020 | Sharma et al. |
| 2020/0105898 | A1 | 4/2020 | Hsu et al. |
| 2020/0357927 | A1 | 11/2020 | Hsieh et al. |
| 2021/0119003 | A1 | 4/2021 | Van et al. |
| 2021/0175340 | A1* | 6/2021 | Ramaswamy ....... H10N 70/253 |
| 2023/0238444 | A1 | 7/2023 | Gosavi et al. |

OTHER PUBLICATIONS

Lomenzo, Patrick D., et al., "Universal Curie constant and pyroelectricity in doped ferroelectric HfO2 thin films", Nano Energy, ISSN: 2211-2855, vol. 74, Issue: 104733, Apr. 18, 2020, 1-10.

Mikolajick, Thomas, et al., "Ferroelectric hafnium oxide for ferroelectric random-access memories and ferroelectric field-effect transistors", MRS Bulletin. vol. 43., May 2018, pp. 340-346.

* cited by examiner

METHOD OF PRODUCING A SEMICONDUCTOR DEVICE HAVING A FERROELECTRIC GATE STACK

BACKGROUND

SiC (silicon carbide) power MOSFETs (metal-oxide-semiconductor field-effect transistors) are well-suited for high power, high voltage, high temperature and radiation resistance applications. A key limiting factor for SiC MOSFET development is accommodating the power device in switching applications at short circuit conditions. MOSFETs are sensitive to excessive voltage and temperature which leads to over-heating. Over a longer period, overheating seriously affects device reliability and performance, finally resulting in hard destruction of the device. Techniques have been devised to prevent continuous operation of MOSFETs during short circuit conditions, including efficient ways to dissipate heat and smart gate drive designs that turn-off the device at high operating temperatures.

Heat dissipation mechanisms typically involve passive measures via a heat sink, thereby avoiding over-heating. Furthermore, temperature sensors may be embedded in a power MOSFET die (chip) to detect operating temperature used for preventing high-temperature operation. Integrated current sensors occupy a significant amount of die area, requiring a higher power density for the active transistor cells of the device.

SiC MOSFETs have 5 to 10 times higher current density under short circuit conditions compared to IGBTs (insulated-gate bipolar transistors). Higher instantaneous power density and smaller thermal capacitance results in faster temperature rise and lower short circuit withstand time, placing immense pressure on the design of gate drivers that need to have very fast response times—much smaller than needed for IGBTs. Die protection can be ensured only by the gate drive to detect the overcurrent condition and turn-off the MOSFET within the withstand time off (e.g., about 3 ms), which poses a tough design challenge.

Thus, there is a need for a SiC device design with improved short-circuit/overcurrent protection.

SUMMARY

According to an embodiment of a semiconductor device, the semiconductor device comprises: a SiC substrate; and a plurality of transistor cells formed in the SiC substrate and electrically connected in parallel to form a transistor, wherein each transistor cell of the plurality of transistor cells comprises a gate structure including a gate electrode and a gate dielectric stack separating the gate electrode from the SiC substrate, wherein the gate dielectric stack comprises a ferroelectric insulator, wherein the transistor has a specified operating temperature range, wherein the ferroelectric insulator is doped with a doping material such that the Curie temperature of the ferroelectric insulator is in a range above the specified operating temperature range of the transistor.

According to an embodiment of a method of producing a semiconductor device, the method comprises: forming a plurality of transistor cells in a SiC substrate and electrically connected in parallel to form a transistor, wherein forming each transistor cell of the plurality of transistor cells comprises forming a gate structure including a gate electrode, and a gate dielectric stack separating the gate electrode from the SiC substrate and comprising a ferroelectric insulator, wherein the transistor has a specified operating temperature range; and doping the ferroelectric insulator with a doping material such that the Curie temperature of the ferroelectric insulator is in a range above the specified operating temperature range of the transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
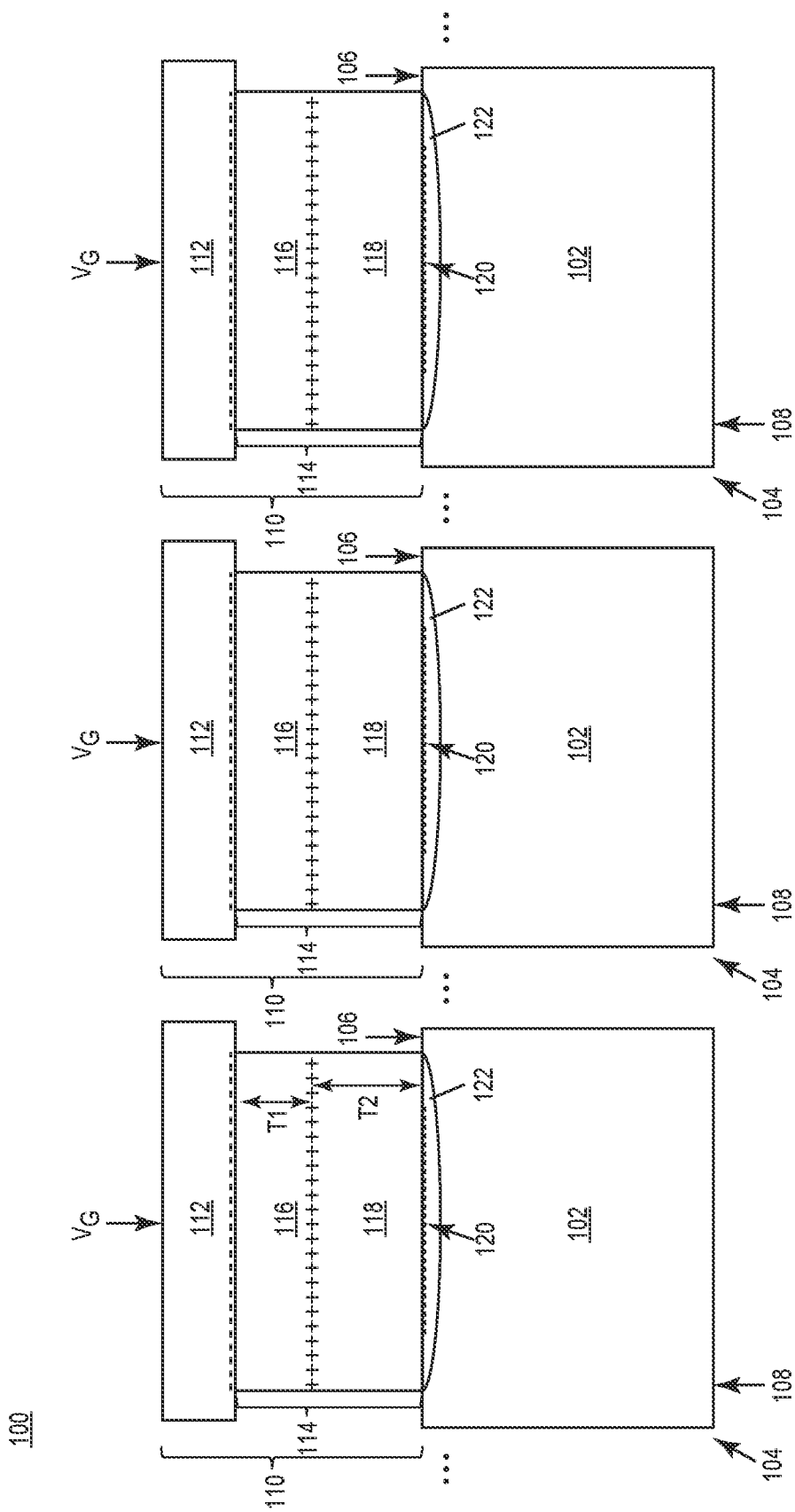
FIG. 1 illustrates a partial cross-sectional view of an embodiment of a semiconductor device that includes a ferroelectric-based gate dielectric stack.

Described herein is a gate dielectric stack that provides improved short-circuit/overcurrent protection for semiconductor devices. The type of semiconductor device that includes the gate dielectric stack may depend on the application of interest and may include power semiconductor devices which are semiconductor devices used as switches or rectifiers in power electronic circuits. Regardless of the type of semiconductor device, a plurality of transistor cells formed in a semiconductor substrate utilize the gate dielectric stack and are electrically connected in parallel to form a transistor.

The gate dielectric stack includes a ferroelectric insulator as a key enabler towards improved short-circuit/overcurrent protection. This insulator is 'ferroelectric' in that the insulator has a spontaneous electric polarization that can be reversed by the application of an external electric field, unlike non-ferroelectric insulators such as $SiO_2$ and SiN which do not have such a reversible spontaneous electric polarization.

The ferroelectric insulator is doped with a doping material such that the Curie temperature of the ferroelectric insulator is in a range above the specified operating temperature range of the device where the specified operating temperature range defines the minimum and maximum operating temperatures for the device. For short periods of time, the device temperature may exceed the maximum operating temperature, e.g., due to a short-circuit condition. Above this temperature, the ferroelectric insulator of the gate dielectric stack loses its polarization which in turn causes the threshold voltage of the device to increase. Accordingly, a higher gate voltage is required to create the conductive channel outside the specified operating temperature range than what is required within the specified operating temperature range.

The ferroelectric insulator included in the gate dielectric stack exhibits spontaneous electrical polarization. This polarization is retained until a characteristic temperature, called the Curie temperature (Tc) or Curie point. The Curie temperature is the temperature above which the ferroelectric insulator loses its ferroelectric properties and electrical polarization. Accordingly, a nearly fixed amount of gate voltage polarizes the ferroelectric insulator and a conductive channel is created below the Curie temperature. Above the Curie temperature, the ferroelectric insulator is no longer polarized so that the dielectric constant decreases and a higher gate voltage is required to create the channel, thus helping to limit overcurrent conditions. By integrating the ferroelectric insulator into the gate dielectric stack of the device, the device becomes temperature sensitive such that the device self-regulates the drain current beyond the maximum safe operating temperature of the device.

The ferroelectric-based gate dielectric stack may be used in any type of semiconductor device that includes a plurality of transistor cells formed in a semiconductor substrate and electrically connected in parallel to form a transistor. For example, the semiconductor substrate may be a SiC substrate, a Si substrate, a GaN substrate, etc. The transistor may be a vertical transistor or a lateral transistor. For example, the transistor may be a power MOSFET, IGBT, gate turn-off thyristor, HEMT (high-electron mobility transistor), etc.

In each case, the ferroelectric insulator of the gate dielectric stack includes a doping material that sets the Curie temperature of the ferroelectric insulator in a range above the specified operating temperature range of the transistor device. The dopant material may be one or more dopants such as Al, Si, Gd, Yr, La, Sr, and/or Zr, an alloy, etc. depending on the type of ferroelectric insulator used.

The ferroelectric insulator may comprise hafnium oxide ($HfO_2$), for example. However, other ferroelectric insulating materials may be used such as but not limited to aluminum nitride with scandium doping.

In the case of hafnium oxide, the doping material used to realize ferroelectricity in $HfO_2$ in the desired temperature range may be different dopants such as Al, Si, Gd, Yr, La, Sr, and/or Zr. Depending on the dopant concentration, the ferroelectric properties of doped $HfO_2$ varies. For example, ferroelectricity is observed when Si concentration is varied from 2 to 8%. Similarly, considerable ferroelectricity is observed for Sr (2.5%), Gd (3.7%), Al (3.7%), La (16.7%). The dopant concentration may be adjusted depending upon the application, to tune the Curie temperature.

The gate dielectric stack may include just the ferroelectric insulator and no other dielectric layers.

The gate dielectric stack may instead include one or more non-ferroelectric insulating layers in addition to the ferroelectric insulator. For example, the gate dielectric stack may include both the ferroelectric insulator and a first non-ferroelectric insulator. The first non-ferroelectric insulator may contact the semiconductor substrate. The first non-ferroelectric insulator may comprise silicon dioxide ($SiO_2$) and the interface region between the silicon dioxide and the semiconductor substrate may contain nitrogen within the silicon dioxide in the case of a SiC substrate.

In the case of a SiC substrate, a silicon dioxide insulator may be a thermally grown or deposited layer that is annealed to maintain superior SiO2/SiC interface properties and channel mobility, respectively.

In the case of silicon dioxide as the first non-ferroelectric insulator and hafnium oxide as the ferroelectric insulator, a combined thickness of the silicon dioxide and the hafnium oxide may be in a range of 10 nm to 200 nm.

The ferroelectric insulator may be thicker than the first non-ferroelectric insulator.

The gate dielectric stack may further include a second non-ferroelectric insulator and the ferroelectric insulator may be interposed between the first and second non-ferroelectric insulators or on top of the second non-ferroelectric insulator.

The first non-ferroelectric insulator may contact the semiconductor substrate and comprise silicon dioxide, the ferroelectric insulator may comprise hafnium oxide, and the second non-ferroelectric insulator may comprise silicon dioxide or aluminum oxide or hafnium oxide with a doping level resulting in a Curie temperature below the minimum operation temperature.

The second non-ferroelectric insulator may be thinner or thicker or of similar thickness than the first non-ferroelectric insulator, depending on the type of material used for the second non-ferroelectric insulator. For example, the second non-ferroelectric insulator may be thinner than the first non-ferroelectric insulator if the second non-ferroelectric insulator comprises silicon dioxide. The second non-ferroelectric insulator instead may be thicker than the first non-ferroelectric insulator if the second non-ferroelectric insulator comprises a high-k dielectric such as aluminum oxide or hafnium oxide with a doping level resulting in a Curie temperature below the minimum operation temperature.

One or more additional ferroelectric and/or non-ferroelectric layers may be disposed between the ferroelectric insulator and the first non-ferroelectric insulator and/or the second non-ferroelectric insulator. The dielectric constant of the additional non-ferroelectric layer/layers may be higher than the dielectric constant of silicon dioxide such as for example more than 20% higher or even more than 100% higher or even more that 300% higher.

To enable a good thermal coupling of the ferroelectric insulator, the thickness of an oxide layer or of a multilayer stack of non-ferroelectric materials implemented between the semiconductor substrate and the ferroelectric insulator may be below 50 nm.

At room temperature, the polarization of the ferroelectric insulator acts like a positive gate charge thereby reducing the threshold voltage of the device. The amount of threshold voltage reduction depends on the doping of the ferroelectric insulator and on the thickness ratio of the ferroelectric insulator to any non-ferroelectric insulator included in the gate dielectric stack. The body region doping of the device may be increased and/or the thickness of the gate dielectric stack may be increased to achieve approximately the same room-temperature threshold voltage as a conventional MOSFET having a $SiO_2$ gate oxide but without any ferroelectric material. Such an approach ensures widely unchanged electrical device properties below the Curie temperature.

As the device begins to reach a short circuit condition, a rapid rise in temperature occurs. Once the temperature exceeds the Curie temperature, the ferroelectric insulator in the gate dielectric stack almost instantaneously (in the nanosecond range) undergoes a phase transition. Accordingly, polarization in the ferroelectric insulator is lost which leads to an almost immediate increase in the threshold voltage of the device. This increase in threshold voltage reduces the overdrive voltage (gate-to-source voltage minus threshold voltage), which ultimately reduces the drain current. With lower drain current, lower heat generation is ensured. Once the operating temperature drops to within the safe operating range, the ferroelectric insulator regains its ferroelectric polarization and the threshold voltage is restored to the same voltage as before the short circuit event. For the case of current filamentation resulting in local hotspots during the short-circuit event, the described measure is very effective to counteract this current filamentation and local self-heating.

The reduction in drain current owing to the phase transition in the ferroelectric-based gate dielectric stack of the device allows the gate drive to act towards safely turning off the device over a critical time-period, significantly improving short circuit reliability. The ferroelectric-based gate dielectric stack decouples or eliminates the strict trade-off between a low $R_{ON}XA$ (area-specific on resistance) at normal operation temperatures and limited non-destructive peak currents in the case of a short-circuit event.

Described next, with reference to the figures, are exemplary embodiments of the ferroelectric-based gate dielectric stack and corresponding methods of production. Some of the figures are explained in the context of a particular semiconductor material system and/or device type for ease of explanation and/or illustration. However, as explained above, the ferroelectric-based gate dielectric stack may be used in any type of semiconductor device that includes a plurality of transistor cells formed in a semiconductor substrate and electrically connected in parallel to form a transistor with vertical current flow.

FIG. 1 illustrates a partial cross-sectional view of an embodiment of a semiconductor device 100 that includes a semiconductor substrate 102. The semiconductor substrate 102 may comprise any type of semiconductor material such as SiC, Si, GaN, etc. The semiconductor substrate 102 may include a base semiconductor and one or more epitaxial layers grown on the base semiconductor.

The partial cross-sectional view of FIG. 1 is in the gate region of three (3) neighboring transistor cells 104 formed in the semiconductor substrate 102. The device 100 may include 10 s, 100 s, 1000 s or even more of the transistor cells 104 as indicated by the dashed horizontal lines in FIG. 1. The transistor cells 104 are electrically connected in parallel to form a transistor. For example, the transistor cells 104 may share a source or emitter connection, a drain or collector connection, and a gate connection. The resulting transistor may be a vertical transistor in that the primary current flow direction is between the front and back surfaces 106, 108 of the semiconductor substrate 102. The transistor instead may be a lateral transistor in that the primary current flow direction is along the front surface 106 of the semiconductor substrate 102.

In either case, each transistor cell 104 includes a gate structure 110 including a gate electrode 112 and a gate dielectric stack 114 separating the gate electrode 112 from the semiconductor substrate 102. FIG. 1 shows the semiconductor device 100 implemented as a planar gate device in that the gate structure 110 is formed on the front surface 106 of the semiconductor substrate 102. However, the semiconductor device 100 instead may be implemented as a trench gate device in that the gate structure 110 may be disposed in a trench formed in the front surface 106 of the semiconductor substrate 102.

In either case, the gate dielectric stack 114 includes a ferroelectric insulator 116. The gate dielectric stack 114 may include just the ferroelectric insulator 116 and no other insulating layers. The ferroelectric insulator 116 may comprise a single layer. The ferroelectric insulator 116 instead may comprise two or more layers having different doping levels. Separately or in combination, the ferroelectric insulator 116 may comprise two or more different ferroelectric materials. For example, the ferroelectric insulator 116 may comprise doped $HfO_2$ and AlScN.

According to the embodiment illustrated in FIG. 1, the gate dielectric stack 114 also includes a first non-ferroelectric insulator 118. The first non-ferroelectric insulator 118 may contact the semiconductor substrate 102. In the case of SiC as the semiconductor substrate 102, the first non-ferroelectric insulator 118 may comprise silicon dioxide ($SiO_2$) and the region close to the interface between the silicon dioxide and the SiC-based semiconductor substrate 102 may beneficially contain nitrogen. For example, after the formation of the gate dielectric stack 114, a suitable post-annealing step may be performed to obtain a good quality and stability of the gate oxide semiconductor interface. The annealing step may be performed, e.g., in an NO atmosphere. However, other semiconductor materials may be used and the first non-ferroelectric insulator 118 may comprise a different material or be omitted.

The ratio ($\varepsilon r1/T1$) of relative permittivity ($\varepsilon r1$) to thickness (T1) for the ferroelectric insulator 116 may be equal or be within a predetermined range of the ratio ($\varepsilon r2/T2$) of relative permittivity ($\varepsilon r2$) to thickness (T2) for the first non-ferroelectric insulator 118. For example, $\varepsilon r1/T1$ may equal $\varepsilon r2/T2$. However, the ideal ratio may be more complicated because different insulators have different breakdown strength. For example, $SiO_2$ can sustain higher fields (e.g., 10 MV/cm) while some high-k materials can only block about 5 MV/cm. If $\varepsilon r1/T1=\varepsilon r2/T2$, equal electric fields would result in both the ferroelectric insulator 116 and the first non-ferroelectric insulator 118 which may not be ideal if one insulator is much 'weaker' than the other. Another approach would be to adjust the thicknesses based on: $\varepsilon r1/(EBD1*T1)=\varepsilon r2/(EBD2*T2)$ where EDB1 and EBD2 are the intrinsic breakdown strengths of the ferroelectric insulator 116 and the first non-ferroelectric insulator 118, respectively. The thicknesses T1, T2 may differ from this ratio by more than 100% (i.e., by more than a factor of 2).

In each case, the transistor formed by the parallel-connected transistor cells 104 has a specified operating temperature range over which the transistor is expected to safely operate. For example, the specified operating temperature range may be from −55° C. to 200° C., −55° C. to 175° C., −40° C. to 150° C., etc. The ferroelectric insulator 116 of the gate dielectric stack 114 is doped with a doping material such that the Curie temperature ($T_C$) of the ferroelectric insulator 116 is in a range above the specified operating temperature range of the transistor.

As explained above, a relatively fixed amount of gate voltage '$V_G$' polarizes the ferroelectric insulator 116 below the Curie temperature as indicated by the vertically offset rows of negative ('−') and positive ('+') charges in FIG. 1. Accordingly, a conductive channel 120 is created below the Curie temperature ($T_C$) in a body region 122 of each transistor cell 104. The conductive channel 120 is shown as an electron inversion layer for an n-channel device. The conductive channel 120 instead may be a hole inversion layer for a p-channel device. For a p-channel device, the gate voltage $V_G$ would polarize the ferroelectric insulator 116 in the opposite manner as shown in FIG. 1.

Above the Curie temperature Tc, the ferroelectric insulator 116 is no longer polarized and a higher gate voltage $V_G$ is required to create the channel 120, thus helping to limit overcurrent conditions. Also, the permittivity of the ferroelectric insulator 116 changes when going from below Tc to above Tc. For example, in the case of $HfO_2$, the permittivity may change from 26 to 28 when going from below Tc to above Tc.

Figure 2:
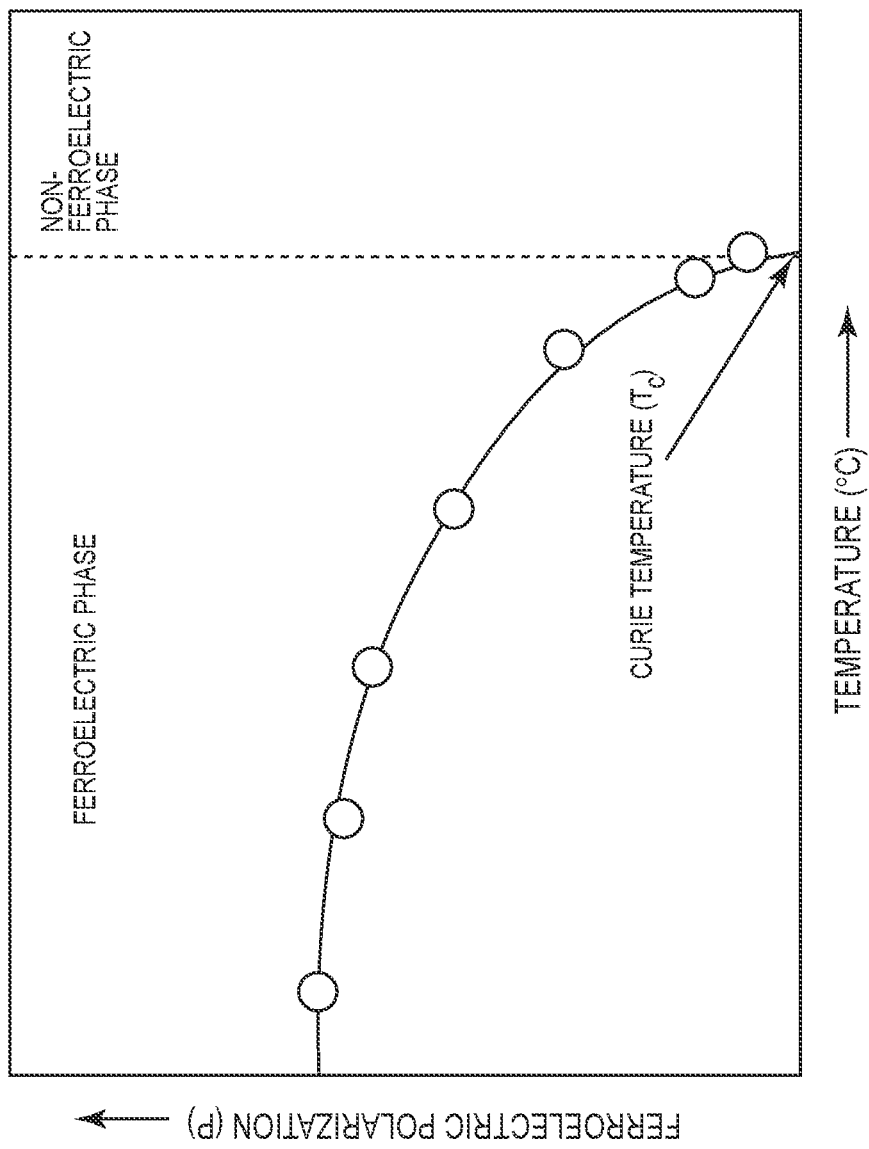
FIG. 2 illustrates a graph showing the polarization that occurs within the ferroelectric insulator of the gate dielectric stack below the Curie temperature Tc and loss of the polarization above the Curie temperature.

FIG. 2 illustrates the polarization 'P' that occurs in the ferroelectric insulator 116 below the Curie temperature Tc and the loss of polarization that occurs in the ferroelectric insulator 116 above the Curie temperature. Electrically, an increase in device temperature above Tc leads to no significant polarization in the ferroelectric insulator 116 such that the ferroelectric insulator 116 transitions from the ferroelectric phase to a paraelectric phase. Structurally, a change from non-centrosymmetric (orthorhombic) form to centrosymmetric (paraelectric tetragonal) form brings about this change. In addition to the loss in electric polarization, dielectric permittivity increases with a rise in temperature towards $T_C$.

For device operation, this means that below $T_C$ the ferroelectric insulator 116 has a polarization charge and the gate voltage $V_G$ required to create the channel or inversion layer 120 is $V_{GE,th1}$. As the ferroelectric insulator 116 retains the polarization when operated below the Curie temperature Tc, the semiconductor device 100 can still be turned on by applying $V_{GE,th1}$. When the same device 100 is operated above $T_C$, the ferroelectric insulator 116 loses its strong polarization and becomes paraelectric. In this case, the amount of gate voltage $V_G$ needed to create the channel/inversion layer 120 is $V_{GE,th2}$ where $V_{GE,th2} > V_{GE,th1}$.

Figure 3:
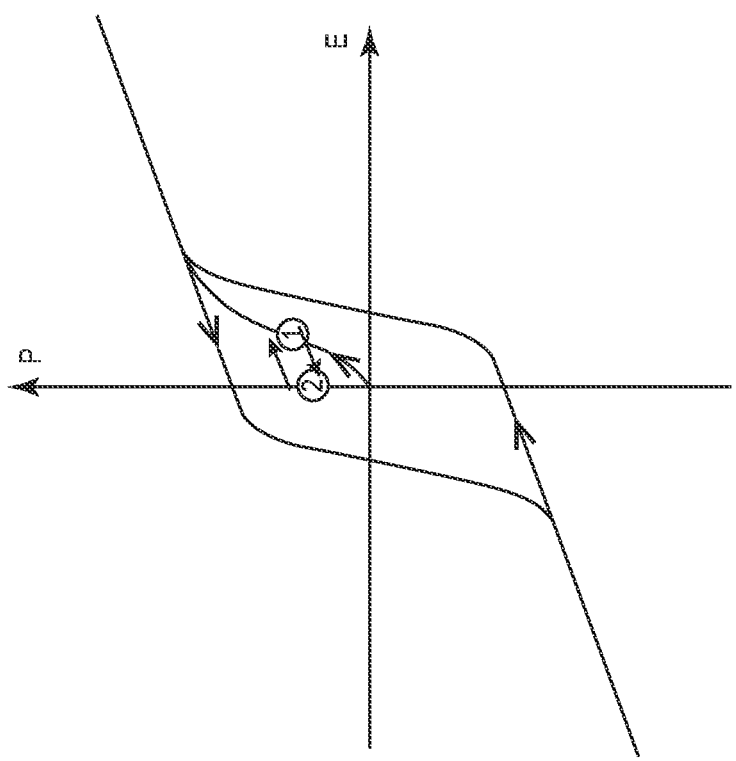
FIG. 3 illustrates a characteristic hysteresis loop as a function of induced polarization and applied electric field for the ferroelectric insulator of the gate dielectric stack.

FIG. 3 illustrates a characteristic hysteresis loop as a function of induced polarization 'P' and applied electric field 'E' for the ferroelectric insulator 116. As the gate voltage $V_G$ is applied for the first time, the ferroelectric domains align and the voltage drop across the ferroelectric insulator 116 enables the ferroelectric insulator 116 to attain a stable polarization state (state '1' '2' in FIG. 3). For switching applications, transistor devices are rapidly turned-off and turned-on. For the next turn-on event and as the gate voltage $V_G$ is applied, the voltage drop across the ferroelectric insulator 116 again drives the ferroelectric polarization to the previously turned-on phase (as indicated by the line going from state '2' to state '1' in FIG. 3). So long as the ferroelectric polarization is maintained in the ferroelectric insulator 116, the device continues to be turned on at a specific gate voltage V G (as indicated by the lines going between states '1' and '2' in FIG. 3).

For the example shown in FIG. 1, and wherein the ferroelectric insulator 116 comprises $HfO_2$ and the first non-ferroelectric insulator 118 comprises $SiO_2$, the ferroelectric polarization in $HfO_2$ may be tuned, e.g., by adjusting the type of dopant material and/or dopant concentration. The doping material used to realize and tune ferroelectricity in $HfO_2$ may be different dopants such as Al, Si, Gd, Yr, La, Sr, and/or Zr. Depending on the concentration of dopants, the ferroelectric properties of doped $HfO_2$ varies. For example, ferroelectricity is observed when Si concentration is varied from 2 to 8%. Similarly, considerable ferroelectricity is observed for Sr (2.5%), Gd (3.7%), Al (3.7%), La (16.7%). The dopant concentration may be tuned accordingly, depending upon the application.

The thicknesses of $SiO_2$ and $HfO_2$ also may be adjusted to tune the ferroelectric polarization in the ferroelectric insulator 116. For example, the ferroelectric polarization in the ferroelectric insulator 116 may be tuned such that the polarization reduces to very low values at 250° C. For the example of the first non-ferroelectric insulator 118 comprising $SiO_2$ and the ferroelectric insulator 116 comprising $HfO_2$, a combined thickness of the $SiO_2$ and $HfO_2$ may be in a range of 10 nm to 200 nm. Separately or in combination, the ferroelectric insulator 116 may be thicker than the first non-ferroelectric insulator 118.

Figure 4:
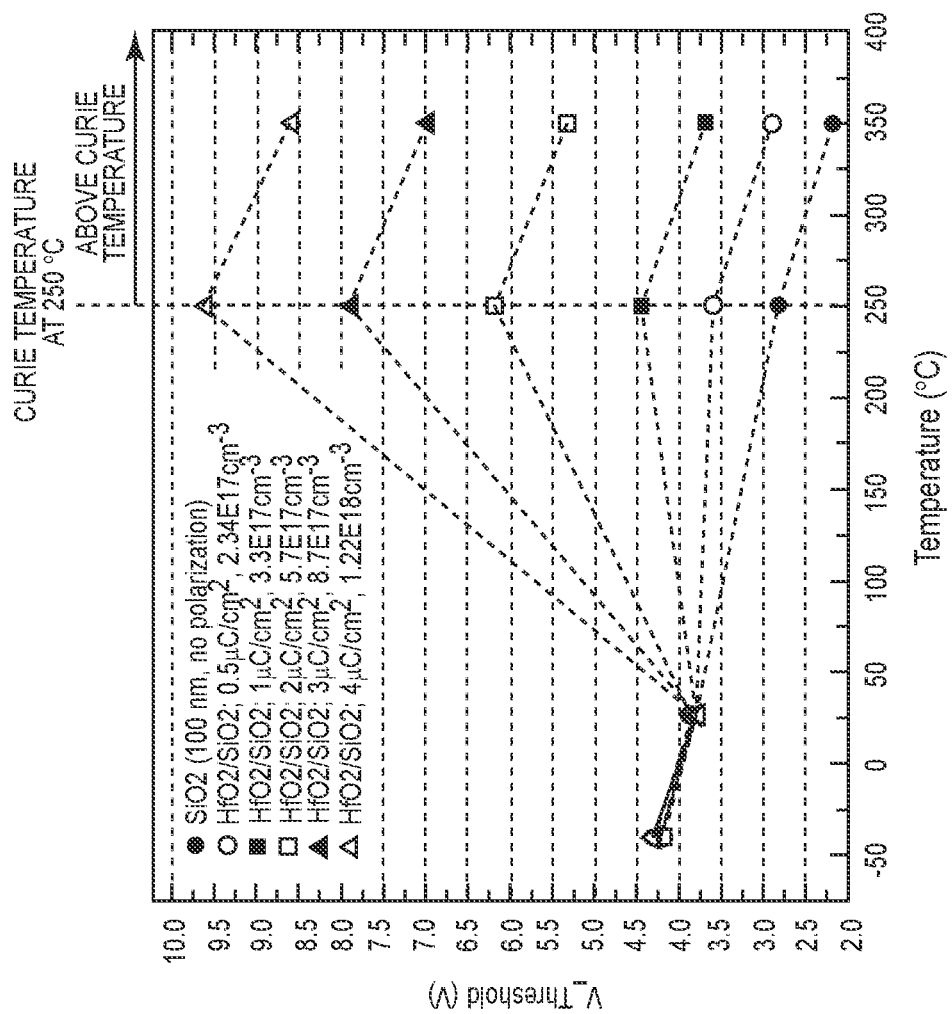
FIG. 4 illustrates a graph of threshold voltage over temperature for different gate dielectric stack structures.

FIG. 4 plots threshold voltage (V_Threshold) over temperature (° C.) for different gate dielectric stack examples, including a standard $SiO_2$ gate dielectric having a thickness of 100 nm and no ferroelectric polarization. The other gate dielectric stack examples represent variants of the gate dielectric stack 114 shown in FIG. 1 and where the ferroelectric insulator 116 comprises $HfO_2$ and the first non-ferroelectric insulator 118 comprises $SiO_2$. For these ferroelectric-based examples, the polarization ($\mu C/cm^2$) of the ferroelectric insulator 116 and the doping concentration ($cm^{-3}$) of the device body region 122 are adjusted to show the effect on threshold voltage. The polarization of the ferroelectric insulator 116 ranges from 0.5 $\mu C/cm^2$ to 4 $\mu C/cm^2$ and the doping concentration of the body region 122 ranges from $2.34E17$ $cm^{-3}$ to $1.22E18$ $cm^{-3}$ for the ferroelectric-based examples shown in FIG. 4.

As shown in FIG. 4, the threshold voltage remains approximately the same for the different gate dielectric stack examples below the Curie temperature Tc. With increasing temperature, there is a decrease in the threshold voltage for the device with just $SiO_2$ as the gate dielectric. However, the situation changes for the gate stack with both $HfO_2$ and $SiO_2$ as the gate dielectric. Although below Tc the threshold voltage remains approximately the same for the ferroelectric-based devices as the device without a ferroelectric insulator, above Tc the threshold voltage increases for the ferroelectric-based devices due to the loss of polarization in the ferroelectric insulator. The increase in threshold voltage is more pronounced (larger) with larger polarization of $HfO_2$ in the ferroelectric state. This increased ferroelectric polarization may be compensated with higher body region doping and/or an adapted gate insulator thickness, to provide comparable threshold voltage behavior below Tc. This increase in threshold voltage causes a reduction in drain current at least in regions where current filamentation occurs, thereby quenching the heat generated during short-circuit conditions.

As shown in FIG. 4, the threshold voltage may be increased at the Curie temperature (250° C. in this example) by decreasing the polarization of the ferroelectric insulator 116. The Curie temperature is 250° C. in the example illustrated in FIG. 4 but may be lower or higher, depending on the application. The polarization of the ferroelectric insulator 116 may be adjusted accordingly by modifying the dopant material (e.g., Al, Si, Gd, Yr, La, Sr, and/or Zr for $HfO_2$) and/or dopant concentration.

The doping concentration of the body region 122 may be used to adjust the threshold voltage to a target value below the Curie temperature Tc, e.g., by increasing the implantation dose of the dopant species used to dope the body region 122. In one embodiment, the body region 122 may be doped p-type (for an n-channel device) and the doping concentration of the p-type body region 122 may be a function of the polarization density of the ferroelectric insulator below the Curie temperature, as shown in FIG. 4, such that the device threshold voltage is higher for temperatures above the Curie temperature and lower for temperatures within the specified operating temperature range of the transistor device. For example, the body region 122 may be doped p-type (for an n-channel device) and have a doping concentration in a range of 1E17 cm$^{-3}$ to 2E18 cm$^{-3}$.

Increasing the threshold voltage at the Curie temperature yields a reduction in drain current which reduces the amount of heat generated in the device regions with high current density, and the Curie temperature may be tuned by adjusting the doping concentration of the ferroelectric insulator 116 as explained above. For example, the transistor device may have a maximum operating temperature below 200° C. and the Curie temperature may be tuned between 200° C. and 600° C. or between 200° C. and 800° C. or even higher (e.g., between 200° C. and 1500° C. or higher) by adjusting the doping of the ferroelectric insulator 116 accordingly. In general, the ferroelectric insulator 116 is doped to control/define the Curie temperature which in turn corresponds to undesirable thermal runaway conditions to be mitigated and which may occur during device operation, e.g., due to short-circuit conditions.

Figure 5:
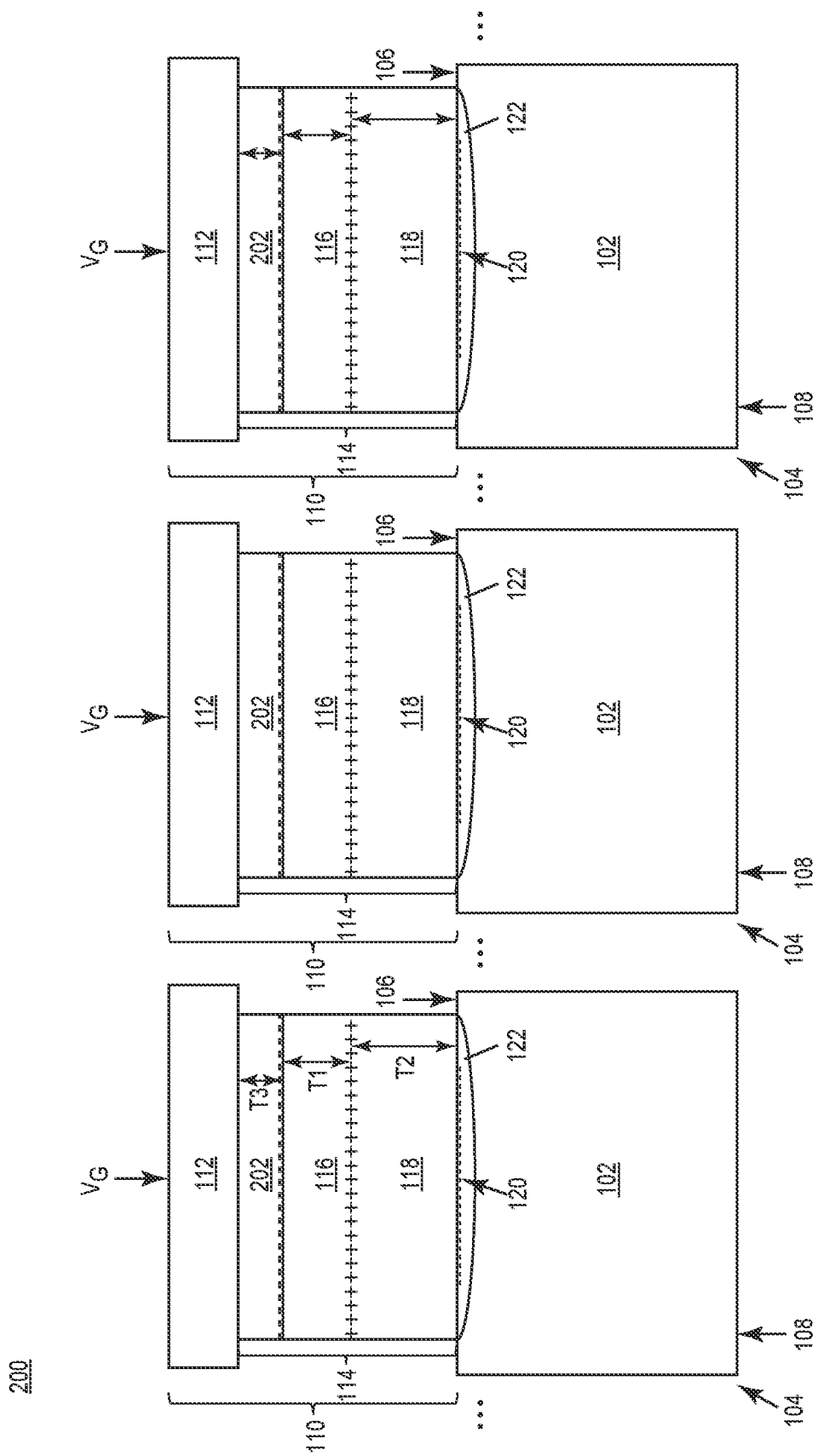
FIG. 5 illustrates a partial cross-sectional view of another embodiment of a semiconductor device that includes a ferroelectric-based gate dielectric stack.

FIG. 5 illustrates a partial cross-sectional view of another embodiment of a semiconductor device 200 that includes the ferroelectric insulator 116 in the gate dielectric stack 114. The embodiment shown in FIG. 5 is similar to the embodiment shown in FIG. 1. Different, however, the gate dielectric stack 114 further includes a second non-ferroelectric insulator 202. The ferroelectric insulator 116 is interposed between the first non-ferroelectric insulator 118 and the second non-ferroelectric insulator 202. In one embodiment, the first non-ferroelectric insulator 118 contacts the semiconductor substrate 102 and comprises silicon dioxide, the ferroelectric insulator 116 comprises hafnium oxide, and the second non-ferroelectric insulator 202 comprises silicon dioxide or aluminum oxide or hafnium oxide with a doping level resulting in a Curie temperature below the minimum operation temperature or any other high-k dielectric which is non-ferroelectric, i.e., a non-ferroelectric material which has no Curie temperature. Separately or in combination, the second non-ferroelectric insulator 202 may be thinner (T3<T2) than the first non-ferroelectric insulator 118. One or more additional non-ferroelectric layers may be disposed between the first non-ferroelectric insulator 118 and the ferroelectric insulator 116 and/or between the second non-ferroelectric insulator 202 and the ferroelectric insulator 116. One or more additional non-ferroelectric layers may be disposed below the first non-ferroelectric insulator 118 and/or above the second non-ferroelectric insulator 202.

Figure 6A:
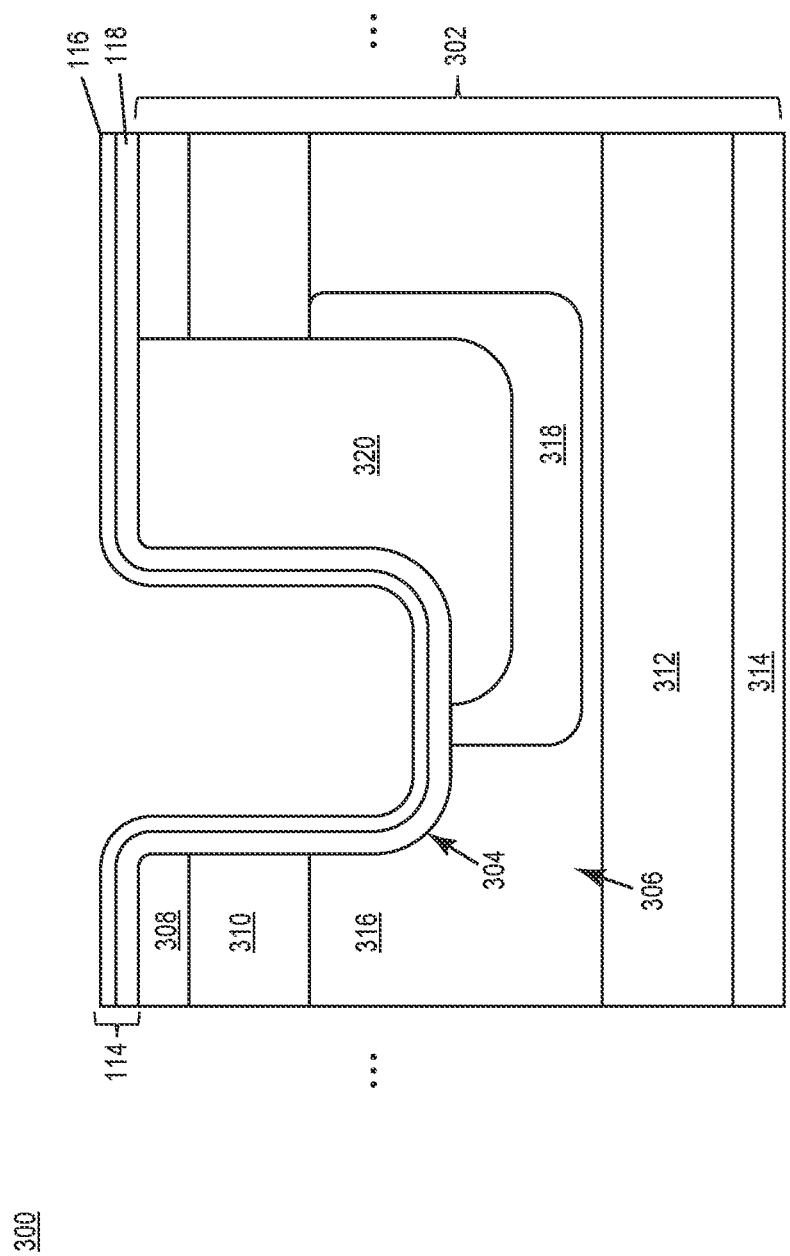
FIGS. 6A and 6B illustrate partial cross-sectional views of an embodiment of a method of forming the gate dielectric stack with the ferroelectric insulator.
Figure 6B:
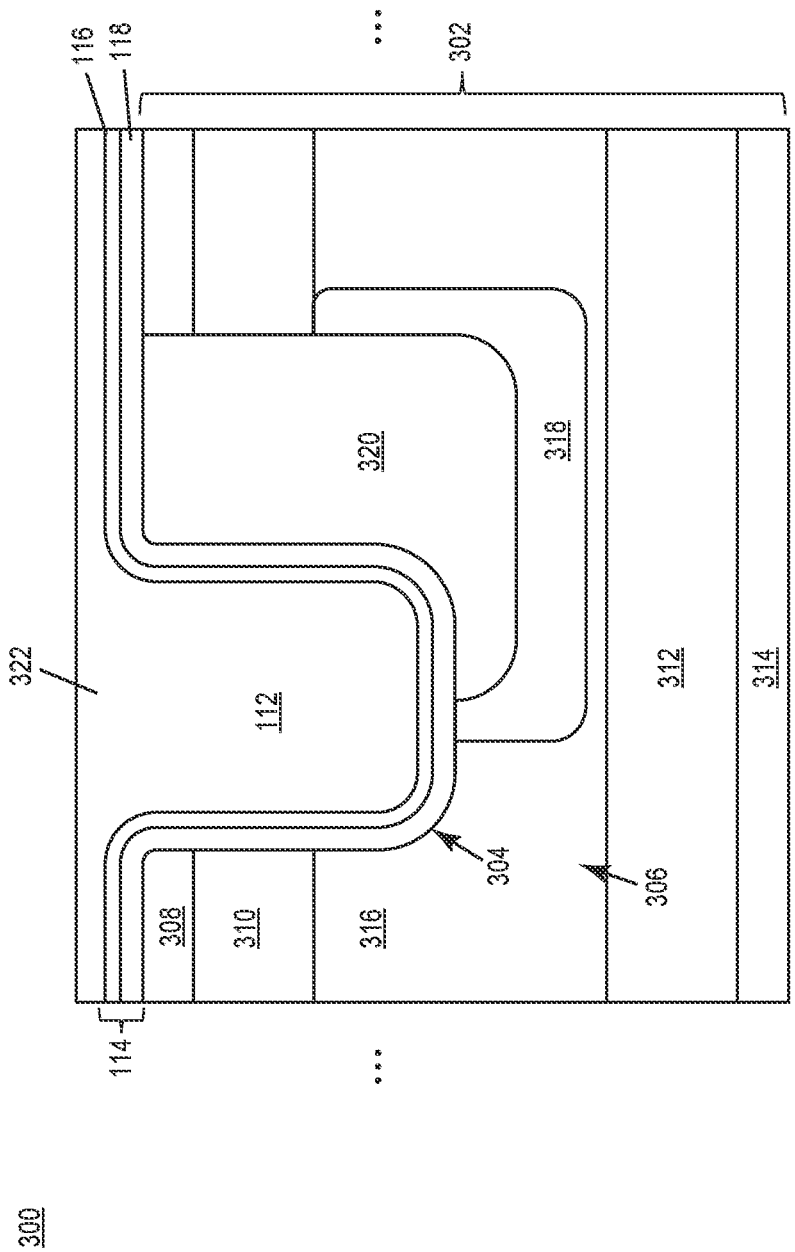

FIGS. 6A and 6B illustrate partial cross-sectional views of an embodiment of a method of forming the gate dielectric stack 114. The method is illustrated in the context of a SiC power transistor device 300. Si-based power MOSFETs can achieve 10 ms short-circuit protection whereas SiC-based devices have a more limited short-circuit response. Hence, the threshold voltage adjustment provided by the ferroelectric insulator 116 is particularly beneficial for the SiC power transistor device 300.

The SiC power transistor device 300 has a trench transistor gate structure formed in a SiC substrate 302. The trench transistor gate structure includes a gate trench 304 formed in the SiC substrate 302, e.g., by etching. Only one transistor cell 306 is shown in FIGS. 6A and 6B. However, the semiconductor device 300 may include 10 s, 100 s, 1000 s or even more of the transistor cells 306 to form a power MOSFET, as indicated by the horizontal dashed lines in FIGS. 6A and 6B. Each transistor cell 306 also includes a source region 308 of a first conductivity type and a body region 310 of a second conductivity type opposite the first conductivity type and disposed at the sidewalls of the gate trench 304. The body region 310 separates the source region 308 from a drift zone 312 of the first conductivity type. A drain region 314 of the first conductivity type adjoins the drift zone 312 at the opposite side of the SiC substrate 302 as the source region 308.

The semiconductor device 300 may also include a current-conduction region 316 of the first conductivity type in the SiC substrate 302 below and adjoining the body region 310. For example, the current-conduction region 316 may adjoin the bottom of the gate trench 304 and may be a JFET (junction field-effect transistor) region.

The semiconductor device 300 may also include a shielding region 318 of the second conductivity type. The shielding region 318 is laterally adjacent to the current-conduction region 316 and configured to at least partly shield the bottom of the gate trench 304 from an electric field during operation of the semiconductor device 300. The gate trench 304 may have rounded corners which leads to enhanced field crowding, and the shielding region 318 limits the electric field in this region of the trench transistor gate structure. The shielding region 318 may be contacted by a contact region 320 of the second conductivity type and that has a higher doping concentration than the shielding region 318.

As previously explained herein, the gate dielectric stack 114 of the semiconductor device 300 may include just the ferroelectric insulator 116 and no other insulating layers or instead may include one or more non-ferroelectric insulating layers in addition to the ferroelectric insulator 116. With this understanding, FIG. 6A shows an example of the gate dielectric stack 114 including the ferroelectric insulator 116 and a first non-ferroelectric insulator 118. The first non-ferroelectric insulator 118 may line the sidewalls and bottom of the gate trench 304 and the ferroelectric insulator 116 may be formed on the first non-ferroelectric insulator 118, e.g., as shown in FIG. 3A. Accordingly, the first non-ferroelectric insulator 118 may contact the SiC substrate 118. The first non-ferroelectric insulator 118 may comprise SiO$_2$ or any other suitable non-ferroelectric insulating material.

In one embodiment, the first non-ferroelectric insulator 118 is formed in contact with the SiC substrate 302 by depositing silicon dioxide on the SiC substrate 302 before forming the ferroelectric insulator 116. The silicon dioxide is then densified at temperatures above 1100° C., and the interface between the silicon dioxide and the SiC substrate 302 is passivated in a nitrogen-containing atmosphere. The ferroelectric insulator 116 is then formed on the first non-ferroelectric insulator 118, e.g., by atomic layer deposition (ALD) in the case of ferroelectric HfO$_2$.

The ferroelectric insulator 116 may be doped in situ or ex situ to set the Curie temperature of the ferroelectric insulator 116 in a range above the specified operating temperature range of the semiconductor device 300. The doping can be realized, e.g., by depositing a layer stack that includes the ferroelectric material and the doping material with a suitable choice of the layer thicknesses and intermixing these materials by a subsequent high-temperature treatment in a range of 250° C. to 1200° C., e.g., 300° C. to 1000° C. A second non-ferroelectric insulator 118 (not shown in FIGS. 6A and 6B) may be formed on the ferroelectric insulator 116 such that the ferroelectric insulator 116 is interposed between two non-ferroelectric insulators, e.g., as shown in FIG. 5.

FIG. 6B shows a gate electrode material 322 formed in the gate trench 304. Any suitable gate electrode material 322 may be used such as polysilicon, metal, metal alloy, etc. The structure may then be planarized, e.g., using CMP (chemical-mechanical polishing) to form the final gate structure which includes the gate electrode 112 and the gate dielectric stack 114 separating the gate electrode 112 from the SiC substrate 302.

Figure 7:
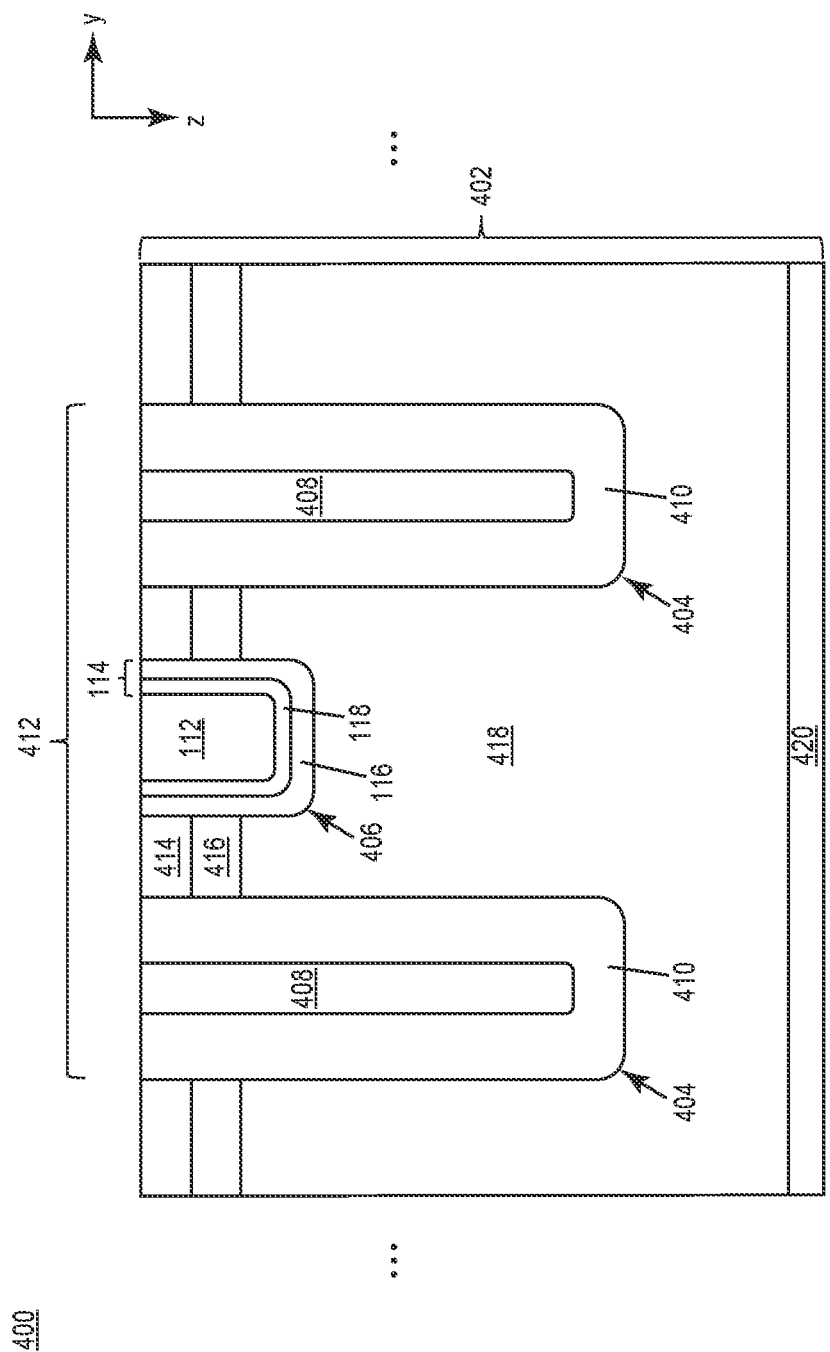
FIG. 7 illustrates a partial cross-sectional view of another embodiment of a semiconductor device that includes a ferroelectric-based gate dielectric stack.

FIG. 7 illustrates a partial cross-sectional view of another embodiment of a semiconductor device 400 that includes the gate dielectric stack 114. According to the embodiment illustrated in FIG. 7, the semiconductor device 400 is a power transistor having a field plate trench configuration.

The semiconductor device 400 includes a semiconductor substrate 402. The semiconductor substrate 402 may include one or more of a variety of semiconductor materials that are used to form semiconductor devices such as power MOSFETs, IGBTs (insulated gate bipolar transistors), HEMTs (high-electron mobility transistors), etc. For example, the semiconductor substrate 402 may include silicon (Si), silicon carbide (SiC), germanium (Ge), silicon germanium (SiGe), gallium nitride (GaN), gallium arsenide (GaAs), and the like. The semiconductor substrate 402 may be a bulk semiconductor material or may include one or more epitaxial layers grown on a bulk semiconductor material.

The semiconductor device 400 further includes field plate trenches 404 formed in the semiconductor substrate 402. The field plate trenches 404 may be needle-shape or stripe-shaped. The semiconductor device 400 also includes gate trenches 406 formed in the semiconductor substrate 102. The gate trenches 406 may be needle-shape or stripe-shaped. The field plate trenches 404 and the gate trenches 406 and interspersed with one another. The term 'needle-shaped' as used herein means a trench structure that is narrow and long in a depth-wise direction (z direction in FIG. 7) of the semiconductor substrate 402. For example, the field plate trenches 404 and/or the gate trenches 406 may resemble a needle, column or spicule in the depth-wise (z) direction of the semiconductor substrate 402. For stripe-shaped trenches, the lengthwise extension runs into and out of the page in FIG. 7.

A field plate 408 is disposed in each field plate trench 404 and separated from the surrounding semiconductor substrate 402 by a field dielectric 410. The field plate trenches 404 may extend deeper into the semiconductor substrate 402 than the gate trenches 406. The field plates 408 and the gate electrodes 112 may be made from any suitable electrically conductive material such as polysilicon, metal, metal alloy, etc. The field plates 408 and the gate electrodes 112 may comprise the same or different electrically conductive material. The field dielectric 410 and the first non-ferroelectric insulator 118, if provided, of the gate dielectric stack 114 may comprise the same or different electrically insulative material, e.g., $SiO_2$ and may be formed by one or more common processes such as thermal oxidation and/or deposition.

Only one transistor cell 412 is shown in FIG. 7. However, the semiconductor device 400 may include 10 s, 100 s, 1000 s or even more of the transistor cells 412 to form a power transistor, as indicated by the horizontal dashed lines in FIG. 7. Each transistor cell 412 also includes a source region 414 of a first conductivity type and a body region 416 of a second conductivity type opposite the first conductivity type and disposed at the sidewalls of the gate trench 406. The body region 416 separates the source region 414 from a drift zone 418 of the first conductivity type. A drain region 420 of the first conductivity type adjoins the drift zone 418 at the opposite side of the semiconductor substrate 402 as the source region 414.

As previously explained herein, semiconductor devices are designed to safely operate over a specified operating temperature range. Operating a semiconductor device outside its specified operating temperature range for long periods of time may result in catastrophic damage. However, short-circuit conditions do occur and the device should turn off as quickly as possible in this high-temperature runaway region. The ferroelectric-based gate dielectric teachings described herein limit the drain current during short-circuit conditions until the device can be safely turned off, by having a Curie temperature in a range above the specified operating temperature range of the device.

By including a ferroelectric material in the gate stack, the threshold voltage increases as the device surpasses the safe operating temperature range and the drain current decreases correspondingly. Incorporation of a ferroelectric material into the gate stack may alter the gate-oxide capacitance (COX) due to the different permittivity of the ferroelectric material. As explained above, the thickness composition of the ferroelectric insulator and any non-ferroelectric insulators included in the gate stack may be adjusted to yield the same COX as for a standard $SiO_2$ gate-oxide stack without a ferroelectric insulator. The temperature effect on threshold voltage also has been described previously herein, as the polarization is introduced in the ferroelectric insulator. However, with induced ferroelectric polarization, the threshold voltage also changes and may be compensated by tailoring the doping concentration of the ferroelectric insulator and/or device body region, e.g., as illustrated in FIG. 4.

Although the present disclosure is not so limited, the following numbered examples demonstrate one or more aspects of the disclosure.

Example 1. A semiconductor device, comprising: a SiC substrate; and a plurality of transistor cells formed in the SiC substrate and electrically connected in parallel to form a transistor, wherein each transistor cell of the plurality of transistor cells comprises a gate structure including a gate electrode and a gate dielectric stack separating the gate electrode from the SiC substrate, wherein the gate dielectric stack comprises a ferroelectric insulator, wherein the transistor has a specified operating temperature range, wherein the ferroelectric insulator is doped with a doping material such that the Curie temperature of the ferroelectric insulator is in a range above the specified operating temperature range of the transistor.

Example 2. The semiconductor device of example 1, wherein the gate dielectric stack further comprises a first non-ferroelectric insulator.

Example 3. The semiconductor device of example 2, wherein the first non-ferroelectric insulator contacts the SiC substrate.

Example 4. The semiconductor device of example 3, wherein the first non-ferroelectric insulator comprises silicon dioxide, and wherein an interface region between the silicon dioxide and the SiC substrate contains nitrogen.

Example 5. The semiconductor device of any of examples 2 through 4, wherein the first non-ferroelectric insulator comprises silicon dioxide, wherein the ferroelectric insulator comprises hafnium oxide, and wherein a combined thickness of the silicon dioxide and the hafnium oxide is in a range of 10 nm to 200 nm.

Example 6. The semiconductor device of any of examples 2 through 5, wherein the ferroelectric insulator is thicker than the first non-ferroelectric insulator.

Example 7. The semiconductor device of any of examples 2 through 6, wherein the gate dielectric stack further comprises a second non-ferroelectric insulator, and wherein the ferroelectric insulator is interposed between the first non-ferroelectric insulator and the second non-ferroelectric insulator.

Example 8. The semiconductor device of example 7, wherein the first non-ferroelectric insulator contacts the SiC substrate and comprises silicon dioxide, wherein the ferroelectric insulator comprises hafnium oxide, and wherein the second non-ferroelectric insulator comprises silicon dioxide or aluminum oxide or hafnium oxide with a doping level resulting in a Curie temperature below the minimum operation temperature.

Example 9. The semiconductor device of example 7 or 8, wherein the first non-ferroelectric insulator contacts the SiC substrate, and wherein the second non-ferroelectric insulator is thinner or thicker than the first non-ferroelectric insulator.

Example 10. The semiconductor device of any of examples 2 through 9, wherein each transistor cell of the plurality of transistor cells further comprises a p-type body region formed in the SiC substrate, and wherein the first non-ferroelectric insulator contacts the p-type body region.

Example 11. The semiconductor device of example 10, wherein the p-type body region has a doping concentration in a range of $1E17$ cm$^{-3}$ to $2E18$ cm$^{-3}$.

Example 12. The semiconductor device of example 10 or 11, wherein a doping concentration of the p-type body region is a function of a polarization density of the ferroelectric insulator below the Curie temperature, such that the transistor has a threshold voltage that is higher for temperatures above the Curie temperature and lower for temperatures within the specified operating temperature range of the transistor.

Example 13. The semiconductor device of any of examples 1 through 12, wherein the ferroelectric insulator comprises hafnium oxide, and wherein the doping material has a doping level such that the Curie temperature of the ferroelectric insulator exceeds 200° C.

Example 14. The semiconductor device of any of examples 1 through 13, wherein the doping material comprises one or more impurity species selected from the group consisting of Al, Si, Gd, Yr, La, Sr, and Zr.

Example 15. The semiconductor device of any of examples 1 through 14, wherein the gate structure of each transistor cell of the plurality of transistor cells is a trench gate structure disposed in a trench formed in the SiC substrate.

Example 16. The semiconductor device of any of examples 1 through 15, wherein the transistor has a maximum operating temperature below 200° C., and wherein the Curie temperature of the ferroelectric insulator is in a range of 200° C. to 1500° C.

Example 17. The semiconductor device of any of examples 1 through 16, wherein the ferroelectric insulator comprises hafnium oxide.

Example 18. The semiconductor device of example 17, wherein the doping material comprises one or more impurity species selected from the group consisting of Al, Si, Gd, Yr, La, Sr, and Zr.

Example 19. The semiconductor device of any of examples 1 through 18, wherein below the Curie temperature, the ferroelectric insulator has a polarization density in a range of 0.5 $\mu$C/cm$^2$ to 4 $\mu$C/cm$^2$.

Example 20. The semiconductor device of any of examples 1 through 19, wherein the transistor has a threshold voltage that is higher at temperatures above the Curie temperature and lower at temperatures within the specified operating temperature range of the transistor.

Example 21. The semiconductor device of any of examples 1 through 20, wherein the ferroelectric insulator comprises two or more layers having different doping levels.

Example 22. The semiconductor device of any of examples 1 through 21, wherein the ferroelectric insulator comprises two or more different ferroelectric materials.

Example 23. The semiconductor device of example 22, wherein the ferroelectric insulator comprises doped HfO$_2$ and AlScN.

Example 24. A method of producing a semiconductor device, the method comprising: forming a plurality of transistor cells in a SiC substrate and electrically connected in parallel to form a transistor, wherein forming each transistor cell of the plurality of transistor cells comprises forming a gate structure including a gate electrode, and a gate dielectric stack separating the gate electrode from the SiC substrate and comprising a ferroelectric insulator, wherein the transistor has a specified operating temperature range; and doping the ferroelectric insulator with a doping material such that the Curie temperature of the ferroelectric insulator is in a range above the specified operating temperature range of the transistor.

Example 25. The method of example 24, wherein the ferroelectric insulator is doped in situ.

Example 26. The method of example 24 or 25, wherein forming the gate dielectric stack further comprises forming a first non-ferroelectric insulator in contact with the SiC substrate.

Example 27. The method of example 26, wherein forming the first non-ferroelectric insulator in contact with the SiC substrate comprises: before forming the ferroelectric insulator, depositing silicon dioxide on the SiC substrate, densifying the silicon dioxide at temperatures above 1100° C., and passivating an interface between the silicon dioxide and the SiC substrate in a nitrogen-containing atmosphere.

Example 28. The method of example 24, wherein doping the ferroelectric insulator comprises: depositing a layer stack that includes the ferroelectric material and the doping material; and intermixing the ferroelectric material and the doping material by a temperature treatment.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a semiconductor device, the method comprising:
   forming a plurality of transistor cells in a SiC substrate and electrically connected in parallel to form a transistor, wherein forming each transistor cell of the plurality of transistor cells comprises forming a gate structure including a gate electrode, and a gate dielectric stack separating the gate electrode from the SiC substrate and comprising a ferroelectric insulator, wherein the transistor has a specified operating temperature range; and doping the ferroelectric insulator with a doping material such that the Curie temperature of the ferroelectric insulator is in a range above the specified operating temperature range of the transistor.

2. The method of claim 1, wherein the ferroelectric insulator is doped in situ.

3. The method of claim 1, wherein forming the gate dielectric stack further comprises forming a first non-ferroelectric insulator in contact with the SiC substrate.

4. The method of claim 3, wherein forming the first non-ferroelectric insulator in contact with the SiC substrate comprises:

before forming the ferroelectric insulator, depositing silicon dioxide on the SiC substrate, densifying the silicon dioxide at temperatures above 1100° C., and passivating an interface between the silicon dioxide and the SiC substrate in a nitrogen-containing atmosphere.

5. The method of claim 1, wherein doping the ferroelectric insulator comprises:

depositing a layer stack that includes the ferroelectric material and the doping material; and intermixing the ferroelectric material and the doping material by a temperature treatment.

6. The method of claim 2, wherein the ferroelectric insulator is thicker than the first non-ferroelectric insulator.

7. The method of claim 2, wherein forming the gate dielectric stack further comprises forming a second non-ferroelectric insulator, and wherein the ferroelectric insulator is interposed between the first non-ferroelectric insulator and the second non-ferroelectric insulator.

8. The method of claim 7, wherein the first non-ferroelectric insulator contacts the SiC substrate and comprises silicon dioxide, wherein the ferroelectric insulator comprises hafnium oxide, and wherein the second non-ferroelectric insulator comprises silicon dioxide or aluminum oxide or hafnium oxide with a doping level resulting in a Curie temperature below the minimum operation temperature.

9. The method of claim 7, wherein the first non-ferroelectric insulator contacts the SiC substrate, and wherein the second non-ferroelectric insulator is thinner or thicker than the first non-ferroelectric insulator.

10. The method of claim 2, wherein each transistor cell of the plurality of transistor cells further comprises forming a p-type body region in the SiC substrate, and wherein the first non-ferroelectric insulator contacts the p-type body region.

11. The method of claim 10, wherein the p-type body region has a doping concentration in a range of $1E17$ cm$^{-3}$ to $2E18$ cm$^{-3}$.

12. The method of claim 10, wherein a doping concentration of the p-type body region is a function of a polarization density of the ferroelectric insulator below the Curie temperature, such that the transistor has a threshold voltage that is higher for temperatures above the Curie temperature and lower for temperatures within the specified operating temperature range of the transistor.

13. The method of claim 1, wherein the ferroelectric insulator comprises hafnium oxide, and wherein the doping material has a doping level such that the Curie temperature of the ferroelectric insulator exceeds 200° C.

14. The method of claim 1, wherein the doping material comprises one or more impurity species selected from the group consisting of Al, Si, Gd, Yr, La, Sr, and Zr.

15. The method of claim 1, wherein forming the gate structure of each transistor cell of the plurality of transistor cells comprises forming a trench gate structure disposed in a trench formed in the SiC substrate.

16. The method of claim 1, wherein the ferroelectric insulator comprises hafnium oxide.

17. The method of claim 1, wherein the ferroelectric insulator is doped ex situ.

18. The method of claim 1, wherein below the Curie temperature, the ferroelectric insulator has a polarization density in a range of 0.5 µC/cm$^2$ to 4 µC/cm$^2$.

19. The method of claim 1, wherein the ferroelectric insulator comprises two or more layers having different doping levels.

20. The method of claim 1, wherein the ferroelectric insulator comprises two or more different ferroelectric materials.

* * * * *